(12) United States Patent
Nafus et al.

(10) Patent No.: US 10,438,806 B2
(45) Date of Patent: Oct. 8, 2019

(54) METHODS AND SYSTEM OF USING ORGANOSILICATES AS PATTERNING FILMS

(71) Applicant: Tokyo Electron Limited, Minato-ku, Tokyo (JP)

(72) Inventors: Kathleen Nafus, Leuven (BE); Serge Biesemans, Leuven (BE)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/964,130

(22) Filed: Apr. 27, 2018

(65) Prior Publication Data

US 2018/0315612 A1    Nov. 1, 2018

Related U.S. Application Data

(60) Provisional application No. 62/491,064, filed on Apr. 27, 2017.

(51) Int. Cl.
| | |
|---|---|
| *H01L 21/306* | (2006.01) |
| *H01L 21/3065* | (2006.01) |
| *H01L 21/02* | (2006.01) |
| *H01L 21/311* | (2006.01) |
| *H01L 21/3105* | (2006.01) |
| *H01L 29/66* | (2006.01) |

(52) U.S. Cl.
CPC .... *H01L 21/3065* (2013.01); *H01L 21/02126* (2013.01); *H01L 21/02203* (2013.01); *H01L 21/02216* (2013.01); *H01L 21/02348* (2013.01); *H01L 21/02359* (2013.01); *H01L 21/3105* (2013.01); *H01L 21/31111* (2013.01); *H01L 21/31138* (2013.01); *H01L 29/66545* (2013.01)

(58) Field of Classification Search
CPC ........... H01L 21/3065; H01L 21/02359; H01L 29/66545; H01L 21/31111; H01L 21/3105; H01L 21/02203; H01L 21/02348; H01L 21/02126; H01L 21/31138; H01L 21/02216
See application file for complete search history.

(56) References Cited

U.S. PATENT DOCUMENTS

| | | | | |
|---|---|---|---|---|
| 2014/0004717 A1* | 1/2014 | Chan | ...................... | C23C 16/045 438/798 |
| 2014/0017895 A1* | 1/2014 | Chan | ................... | H01L 21/3065 438/694 |

* cited by examiner

*Primary Examiner* — Duy Vu N Deo
(74) *Attorney, Agent, or Firm* — Wood Herron & Evans LLP

(57) ABSTRACT

Techniques herein include methods for selectively modifying chemical properties of organosilicates including periodic mesoporous organosilicates (PMOs) in situ for use in fabrication of semiconductor devices. With techniques herein, such materials are manipulated in their chemical properties after deposition and can accordingly be used as sacrificial patterning films and/or as patterning enabling materials. Using selective treatments such as annealing, curing, plasma exposure, and silylation, chemical properties such as etch resistance and hydrophobicity can be changed to enable a given patterning operation. A given film can be etch resistant for one patterning operation, and then changed to be etch removable for a subsequent patterning operation.

19 Claims, 2 Drawing Sheets

METHODS AND SYSTEM OF USING ORGANOSILICATES AS PATTERNING FILMS

CROSS REFERENCE TO RELATED APPLICATIONS

The present application claims the benefit of U.S. Provisional Patent Application No. 62/491,064, filed on Apr. 27, 2017, entitled "Manipulating Properties of Organosilicates for use as a Patterning Films," which is incorporated herein by reference in its entirety.

BACKGROUND OF THE INVENTION

Techniques disclosed herein relate to microfabrication, and relate in particular to microfabrication of semiconductor devices.

In material processing methodologies (such as photolithography), creating patterned layers typically involves the application of a thin layer of radiation-sensitive material, such as photoresist, to an upper surface of a substrate. This radiation-sensitive material is transformed into a relief pattern that can be used as an etch mask to transfer a pattern into one or more underlying layers on the substrate. Patterning of the radiation-sensitive material generally involves exposure by a radiation source through a photomask (and associated optics) onto the radiation-sensitive material using, for example, a photolithography system. This exposure creates a latent pattern within the radiation-sensitive material in that a portion of the material is soluble and a remaining portion is insoluble to a particular developer. The radiation-sensitive material is then developed in that soluble portions are dissolved and removed to yield a relief pattern, which is a topographic or physical pattern. For example, developing can include removal of irradiated regions of the radiation-sensitive material (as in the case of positive photoresist), or non-irradiated regions (as in the case of negative resist) using a corresponding developing solvent. The resulting relief pattern can then function as a mask layer or etch mask.

Various etch techniques can be used for transferring a given relief pattern into an underlying layer. Semiconductor production equipment commonly uses dry, plasma etch processes to selectively remove material using an etching means. Once a relief pattern is formed on a substrate, the substrate is disposed within a plasma processing chamber and an etching chemistry (typically an ionizable, dissociative gas mixture) feeds a plasma such that products of the plasma selectively etch the underlying layer while minimally etching the mask layer. Microfabrication of electronic devices and components typically involves repeating steps of material deposition, pattern creation, and material removal.

SUMMARY

Microfabrication of semiconductor devices involves using various materials to form layers and structures. Some structures formed will remain as part of a given semiconductor device, while other films/structures are temporary or sacrificial. Having access to various film materials with different properties is beneficial because this can provide difference in etch resistivity, electrical characteristics, structural strength, et cetera.

Techniques herein provide microfabrication materials with material properties that can be manipulated or changed after deposition. Such material processing can provide materials that can have, for example, an etch resistivity that can be modified after forming or depositing such materials on a substrate. By way of a non-limiting example, such materials can include organosilicates such as periodic mesoporous organosilicates (PMO) or non-porous methylsilsesquioxane (MSQ). Such PMO material can be spin-on deposited, thermally cured and have selectable etch resistivity based on a particular post-deposition treatment. This means that a given film can be treated to be resistive to a given etch process, used for patterning, and then modified to become capable of being etched by that given etch process. In other words, materials can morph from higher carbon content to a more oxide-like material depending on cure conditions and/or treatment. Such material manipulation is beneficial because a corresponding film can be used as a sacrificial film for one patterning process, and then later be selectably removed after modifying material properties.

One embodiment includes a method of patterning a substrate. The method includes depositing a first low-k material on a working surface of a substrate. A first chemical property of the first low-k material is modified by executing a first treatment process, such as annealing or curing. A patterning process is executed that modifies a second material on the working surface of the substrate. The first chemical property of the first low-k material is modified by executing a second treatment process. Accordingly, properties of PMO materials can be modified and used as sacrificial materials for various patterning operations.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
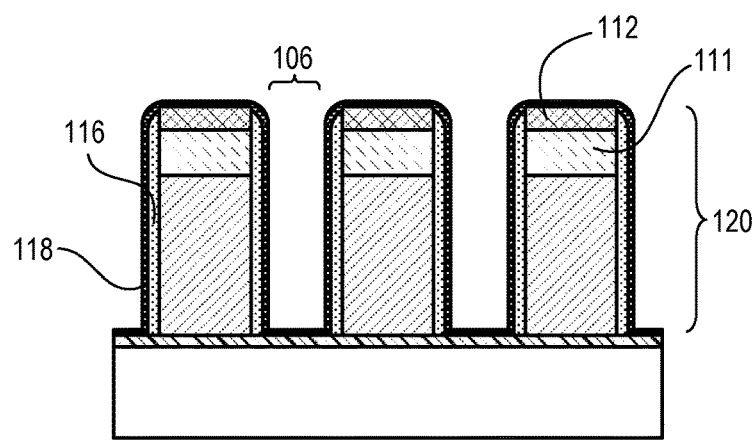
FIG. 1 is cross-sectional schematic view of an example substrate segment showing a process flow according to embodiments disclosed herein.

Techniques herein include methods for manipulating the properties of organosilicates including periodic mesoporous organosilicates (PMOs) and other materials such as non-porous methylsilsesquioxane (MSQ). PMOs can be deposited as a spin-on low-k material. Conventionally, PMOs have been used as a non-sacrificial dielectric. With techniques herein, however, such materials are manipulated in their chemical properties after deposition and used as sacrificial patterning films and/or as patterning enabling materials. For example, such modification can include modifying wet etch selectivity by curing or silylation. For example, annealing a PMO in a nitrogen atmosphere generates a —CH3 terminated surface with higher carbon content. This modification results in a material that can withstand subsequent HF processing. Such a modified material is either not etched by hydrofluoric (HF) acid or is etched at a sufficiently low rate that other materials are etch removed while the modified materially is minimally etched and remains on the substrate. Subsequent annealing of a given PMO in oxygen, O2 plasma, or UV curing with oxygen then results in a lower carbon content and/or hydrophilic film that has a high HF etch rate and can thus be easily removed from a substrate. Applying a silylating agent such as trimethylsilyldiethylamine (TMSDEA) or hexamethyldisilazane (HMDS) will recover a hydrophobic surface and HF resistance. Accordingly, chemical properties such as etch resistance and hydrophobicity are selectively manipulated herein within a given integration scheme to enable a PMO film to function as a sacrificial film. The porous nature of such materials can assist with manipulating the bulk film and not just the surface. In some treatment processes, pores of a PMO are essentially "stuffed" with carbon or ashed in oxygen to manipulate the wet etch selectivity.

As can be appreciated, there are many different patterning applications that can benefit from using a sacrificial PMO film. All of front-end-of-line, middle-end-of-line, and back-end-of-line fabrication can incorporate techniques herein. For convenience in explaining such techniques, the description will focus on one example embodiment. This embodiment is incorporated in replacement metal gate flows, while still being able to have the PMO film removed easily. This particular use example is non-limiting and techniques herein can be used for many additional patterning and integration schemes.

Now, more specifically, techniques herein can be applied to various patterning and integration flows. One such flow is that for tone-reversed, self-aligned contact patterning. For this application, a sacrificial spin-on PMO film can be initially resistant to dilute HF processing during the replacement metal gate (RMG) processing steps, yet removable by wet etching after RMG processing steps are finished. Such PMO material can be etched selective to (without etching) a silicon nitride liner of the gate. The material properties of periodic mesoporous organosilicates (PMOs) can be manipulated to first be HF etch resistant, and then subsequently manipulated to be HF etch removable, by applying different curing techniques. A given selected curing technique can function by varying the carbon content of the film. Depending on chemical-mechanical polishing (CMP) planarization capabilities, the PMO can also be annealed such that the carbon content is reduced enabling an oxide-type CMP process. After such processing the carbon content can then be restored by applying HMDS or TMSDEA silylation processing to replace —OH terminated pore surfaces with —CH3 terminated pore surfaces.

FIGS. 1-6 illustrates such a replacement metal gate process flow as an example use case. Referring to FIG. 1, a pattern of structures 120 is formed, and these structures are to become gate structures. These structures typically include vertical structures with one or more capping materials and sidewall spacers. In this example, there is first capping material 111 and second capping material 112. There is also gap 106 between adjacent structures. Sidewall spacers 116 and liner 118 can be formed on the structures.

Figure 2:
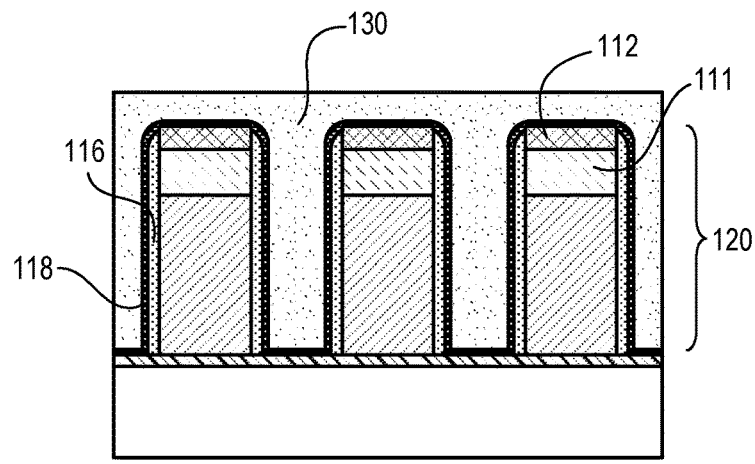
FIG. 2 is cross-sectional schematic view of an example substrate segment showing a process flow according to embodiments disclosed herein.

Next, a gap fill operation is executed that deposits fill material 130 on the substrate to fill open spaces (gaps), as shown in FIG. 2. In this example, the fill material 130 is a PMO material. Deposition of such material can be executed by spin-on deposition, and typically results in there being an overburden of material (fill material above tops of dummy gate structures) as illustrated.

Figure 3:
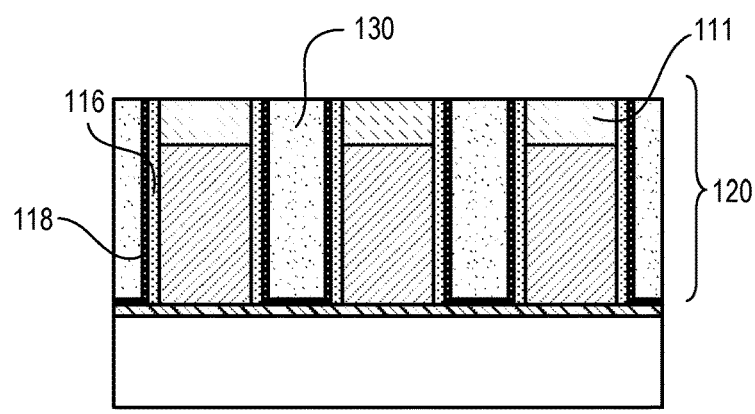
FIG. 3 is cross-sectional schematic view of an example substrate segment showing a process flow according to embodiments disclosed herein.

After deposition of the fill material 130, and depending on a particular integration scheme, the deposited PMO (fill material 130) can be selectively treated to adjust material properties. For example, the PMO can be cured such that template is burned off by baking the substrate in a nitrogen environment at 500-550° C. In other embodiments, a given, selected PMO can have desirable chemical properties (such as etch resistance) as-deposited. In this example flow, the overburden is removed by planarizing the substrate, such as by chemical-mechanical polishing (CMP). An example result is illustrated in FIG. 3. Such a CMP process can remove one or more cap layers of the gate structures. Note that second capping material 112 has been removed. In this flow, the PMO is selected and/or treated to have material properties that function similar to an oxide or low-k material for successful CMP overburden removal.

Figure 4:
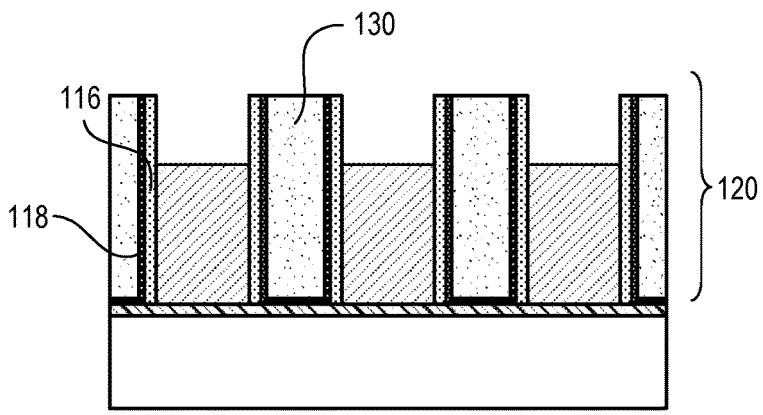
FIG. 4 is cross-sectional schematic view of an example substrate segment showing a process flow according to embodiments disclosed herein.

Next, a temporary gate cap material can be replaced according to a particular process flow. Removal of gate cap material (first capping material 111) is executed without substantially removing or affecting the fill material 130. Prior to dummy gate removal, or subsequent to dummy gate removal, the fill material 130 can be treated, such as with TMSDEA to have the PMO end with —CH3 terminated pores. Note that a given degree of silylation can be impacted by pore size of a given PMO. An example result is illustrated in FIG. 4.

Figure 5:
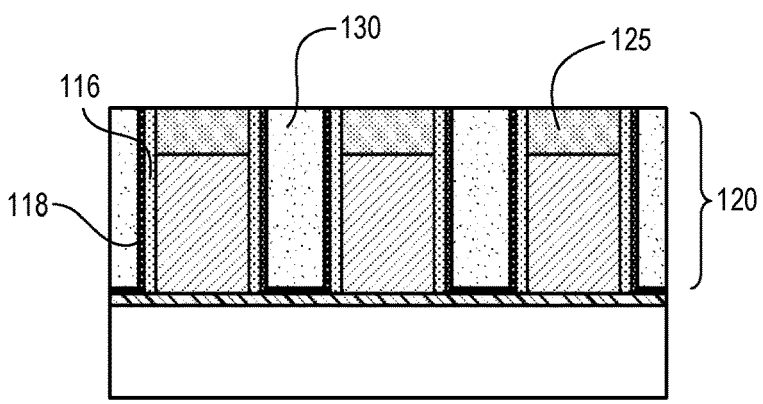
FIG. 5 is cross-sectional schematic view of an example substrate segment showing a process flow according to embodiments disclosed herein.

A replacement gate cap 125 can be deposited on the substrate (FIG. 5). For example, silicon nitride can be deposited as a cap. The PMO filler material needs to be able to withstand such deposition, which is enabled by either selecting a specific PMO and/or modifying chemical properties of the specific PMO after deposition.

Figure 6:
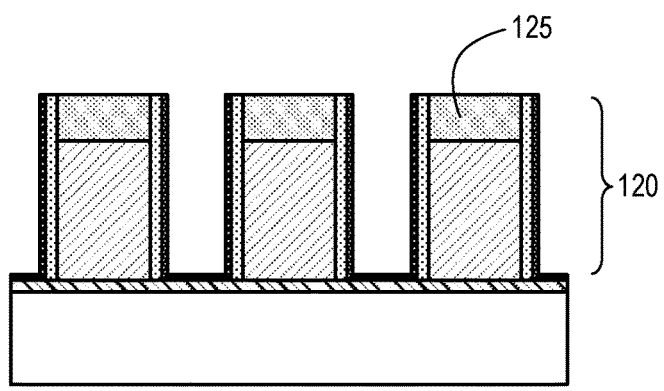
FIG. 6 is cross-sectional schematic view of an example substrate segment showing a process flow according to embodiments disclosed herein.

With a gate cap being replaced, the fill material 130 can now be removed. Such removal can be executed using wet chemistry by changing properties of the fill material 130. For example, the PMO can be treated to remove —CH3 groups. This can be accomplished by UVTA (UV exposure in the presence of oxygen), high temperature bake, or low temperature oxygen. After such treatment, the fill material 130 can be removed, for example, by using an HF acid etch selective to the SiN or other materials (FIG. 6).

Accordingly, PMO materials can be used for patterning integration as a material with modifiable properties to be selectably resistive or selectably etchable to various etchants by one or more modification treatments. Various different PMO materials can be selected. Note that pore size and density can be selected based on a particular integration specification or scheme.

There are several modification treatments available to modify properties of a given PMO. Selection of a given treatment can depend on type of PMO as well as how the PMO is to be used in a corresponding patterning scheme. For annealing, bake temperatures can vary from 400° C. to 500° C. in an N2 atmosphere. Curing in an N2 environment can cause the inside surface to terminate with methyl groups, making a treated PMO hydrophobic. Organic templates can be removed at higher annealing temperatures. Longer curing times can also be used to remove organic templates. For Si—CH3 reduction, treatments can include UV and ozone exposure, baking in an air environment, and oxygen plasma exposure. The PMO can be damaged in such a treatment to be able to be easily removed with HF. For pore CH3 restoration, TMSDEA plasma or HMDS vapor are two selectable treatments. Accordingly, methyl can be replaced, thereby switching between hydrophobic and hydrophilic surfaces. Note that depending on material thickness and material type, the various treatments can be cycled, such as a first step of damaging a PMO followed by a removal step (partial or full removal) of damaged PMO. Then newly uncovered PMO can be damaged and removed in a subsequent cycle.

Accordingly, one example embodiment is a method of patterning a substrate. A first layer of porous organic material is deposited on a substrate. A first treatment process is executed by curing the porous organic material to become HF resistant. Such treatment can result in the porous organic material becoming hydrophobic. Then a second material is removed from the substrate using wet HF chemistry, without removing the porous organic material. Next, a second treatment process is executed that modifies chemical properties of the porous organic material resulting in the porous organic material becoming etchable with HF chemistry. The second treatment process can include UV exposure and/or O2 plasma exposure.

Another embodiment includes a method of patterning a substrate. A first low-k material is deposited on a working surface of a substrate. This first low-k material can include a periodic mesoporous organosilicate (PMO) or non-porous methylsilsesquioxane (MSQ). Such materials can be deposited by spin-on deposition or other deposition technique.

A first chemical property of the first low-k material is modified by executing a first treatment process. Such chemical property can include etch resistivity and/or hydrophobicity. Modification can change the chemical property value either way depending on type of treatment and/or initial properties of the low-k material. For example, the first treatment process can increase or decrease an initial etch resistance value of the first low-k material to a first etchant. Likewise, the first treatment process can increase or decrease an initial hydrophobicity value of the first low-k material. A given chemical property of the material can be modified by annealing the first low-k material in a nitrogen-containing atmosphere, such as until carbon content of the first low-k material is increased causing increased etch resistance to hydrofluoric acid. Other treatment processes include thermal annealing, ultraviolet curing, ozone exposure, oxygen plasma exposure, silylating agent deposition, and vapor exposure.

A patterning process is executed that modifies a second material on the working surface of the substrate. Such a patterning process can be any conventional patterning process such as material deposition, material modification such as doping, or material removal by partial or complete etch removal of the material using a first etchant.

The first chemical property of the first low-k material is then modified by executing a second treatment process (subsequent to the patterning process). Modification can change the first chemical property either way depending on type of treatment and/or initial properties of the low-k material. For example, the second treatment process can increase or decrease a secondary etch resistance value of the first low-k material to a first etchant. This etch resistance can be secondary in that this value was already initially modified in the first treatment process. Likewise, the second treatment process can increase or decrease a secondary hydrophobicity value of the first low-k material. The second treatment process can include annealing the first low-k material in an oxygen-containing environment or using an oxygen-containing plasma. Alternatively, the second treatment can include curing using ultraviolet light, thermal annealing, ultraviolet curing, ozone exposure, oxygen plasma exposure, silylating agent deposition, and vapor exposure.

The treatment process steps herein can be cycled. For example, methods can cycle process steps of (1) modifying the first chemical property of the first low-k material by executing the second treatment process and (2) removing a modified portion of the first low-k material. Some treatment processes may modify only a surface or some percentage of a given low-k material, and so for material removal multiple treatment and removal steps can be executed until a desired amount of material is removed or recessed.

Another embodiment includes a method of patterning a substrate. A first material is deposited on a working surface of a substrate. The first material is a low-k material. The working surface of the substrate includes a second material. The second material is removed from the working surface using a first etchant, while the first material remains on the substrate in that the first material is resistant to the first etchant. Chemical properties of the first material are modified such that the first material is etchable by the first etchant. The first material is then removed from the substrate using the first etchant. The first material can be a periodic mesoporous organosilicate (PMO) or MSQ. Chemical properties of the first material can be modified such that the first material is etchable. Modification can be executed using a first treatment process selected from the group consisting of thermal annealing, ultraviolet curing, ozone exposure, oxygen plasma exposure, silylating agent deposition, and vapor exposure. Accordingly, PMO materials can now be used as sacrificial films by selectively modifying their chemical properties during microfabrication.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
   depositing a first low-k material on a working surface of a substrate;
   modifying a first chemical property of the first low-k material by executing a first treatment process;
   executing a patterning process that modifies a second material on the working surface of the substrate;
   modifying the first chemical property of the first low-k material by executing a second treatment process; and
   cycling the process steps of (1) modifying the first chemical property of the first low-k material by executing the second treatment process and (2) removing a modified portion of the first low-k material.

2. The method of claim 1, wherein depositing the first low-k material includes depositing an organosilicate.

3. The method of claim 1, wherein depositing the first low-k material includes depositing a periodic mesoporous organosilicate (PMO) or a non-porous methylsilsesquioxane (MSQ).

4. The method of claim 1, wherein modifying the first chemical property by executing the first treatment process includes increasing an initial etch resistance value of the first low-k material to a first etchant.

5. The method of claim 1, wherein modifying the first chemical property by executing the first treatment process includes decreasing an initial etch resistance value of the first low-k material to a first etchant.

6. The method of claim 5, further comprising removing the first low-k material from the substrate using the first etchant.

7. The method of claim 1, wherein modifying the first chemical property by executing the first treatment process includes increasing an initial hydrophobicity value of the first low-k material.

8. The method of claim 1, wherein modifying the first chemical property by executing the first treatment process includes decreasing an initial hydrophobicity value of the first low-k material.

9. The method of claim 1, wherein executing the patterning process that modifies the second material includes removing the second material using a first etchant without removing the first low-k material.

10. The method of claim 1, wherein modifying the first chemical property by executing the first treatment process includes annealing the first low-k material in a nitrogen-containing atmosphere.

11. The method of claim 1, wherein modifying the first chemical property by executing the first treatment process includes annealing the first low-k material until carbon content of the first low-k material is increased causing increased etch resistance to hydrofluoric acid.

12. The method of claim 1, wherein modifying the first chemical property by executing the second treatment process includes increasing a secondary etch resistance value of the first low-k material to a first etchant.

13. The method of claim 1, wherein modifying the first chemical property by executing the second treatment process includes decreasing a secondary etch resistance value of the first low-k material to a first etchant.

14. The method of claim 13, wherein modifying the first chemical property by executing the second treatment process includes annealing the first low-k material in an oxygen-containing environment.

15. The method of claim 13, wherein modifying the first chemical property by executing the second treatment process includes annealing the first low-k material using an oxygen-containing plasma.

16. The method of claim 13, wherein modifying the first chemical property by executing the second treatment process includes curing using ultraviolet light.

17. The method of claim 1, wherein modifying the first chemical property of the first low-k material by executing the first treatment process includes executing the first treatment process selected from the group consisting of thermal annealing, ultraviolet curing, ozone exposure, oxygen plasma exposure, silylating agent deposition, and vapor exposure.

18. A method of patterning a substrate, the method comprising:
   depositing a first material on a working surface of a substrate, the first material being a low-k material, the working surface of the substrate including a second material;
   removing the second material from the working surface using a first etchant, the first material remaining on the substrate in that the first material is resistant to the first etchant;
   modifying chemical properties of the first material such that the first material is etchable by the first etchant; and
   removing the first material from the substrate using the first etchant.

19. The method of claim 18, wherein the first material is a periodic mesoporous organosilicate (PMO), and wherein modifying chemical properties of the first material such that the first material is etchable by includes executing a first treatment process selected from the group consisting of thermal annealing, ultraviolet curing, ozone exposure, oxygen plasma exposure, silylating agent deposition, and vapor exposure.

* * * * *

UNITED STATES PATENT AND TRADEMARK OFFICE
CERTIFICATE OF CORRECTION

PATENT NO. : 10,438,806 B2  
APPLICATION NO. : 15/964130  
DATED : October 8, 2019  
INVENTOR(S) : Kathleen Nafus et al.

Page 1 of 1

It is certified that error appears in the above-identified patent and that said Letters Patent is hereby corrected as shown below:

In the Specification

Column 2, Line 59, change "FIG. 1 is cross-sectional schematic view" to --FIG. 1 is a cross-sectional schematic view--.

Column 2, Line 62, change "FIG. 2 is cross-sectional schematic view" to --FIG. 2 is a cross-sectional schematic view--.

Column 2, Line 65, change "FIG. 3 is cross-sectional schematic view" to --FIG. 3 is a cross-sectional schematic view--.

Column 3, Line 1, change "FIG. 4 is cross-sectional schematic view" to --FIG. 4 is a cross-sectional schematic view--.

Column 3, Line 4, change "FIG. 5 is cross-sectional schematic view" to --FIG. 5 is a cross-sectional schematic view--.

Column 3, Line 7, change "FIG. 6 is cross-sectional schematic view" to --FIG. 6 is a cross-sectional schematic view--.

Column 3, Lines 28-30, change "low rate that other materials are etch removed while the modified materially is minimally etched and remains on the" to --low rate that other materials are etch removed while the modified material is minimally etched and remains on the--.

Column 4, Line 11, change "FIGS. 1-6 illustrates such a" to --FIGS. 1-6 illustrate such a--.

In the Claims

Column 8, Line 65, Claim 19, change "the first material is etchable by includes" to --the first material is etchable includes--.

Signed and Sealed this  
Twenty-fourth Day of December, 2019

Andrei Iancu  
*Director of the United States Patent and Trademark Office*